(12) United States Patent
Lee et al.

(10) Patent No.: US 9,664,826 B2
(45) Date of Patent: May 30, 2017

(54) COLOR FILTER SUBSTRATE AND DISPLAY DEVICE

(71) Applicant: E Ink Holdings Inc., Hsinchu (TW)

(72) Inventors: Tai-Yuan Lee, Hsinchu (TW); Po-Yuan Lo, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 71 days.

(21) Appl. No.: 14/274,783

(22) Filed: May 12, 2014

(65) Prior Publication Data
US 2015/0146146 A1 May 28, 2015

(30) Foreign Application Priority Data

Nov. 26, 2013 (TW) .............................. 102143038 A

(51) Int. Cl.
G02F 1/1335 (2006.01)
G02B 5/20 (2006.01)
G02F 1/167 (2006.01)
H01L 27/32 (2006.01)
H01L 51/52 (2006.01)

(52) U.S. Cl.
CPC ....... G02B 5/201 (2013.01); G02F 1/133514 (2013.01); G02F 1/133553 (2013.01); G02F 1/167 (2013.01); H01L 27/322 (2013.01); G02F 2001/133519 (2013.01); G02F 2001/1672 (2013.01); H01L 51/5271 (2013.01)

(58) Field of Classification Search
CPC ... G02F 1/133514; G02F 2001/133519; G02F 2001/1672; G02F 1/167; G02B 5/201; H01L 27/322; H01L 51/5271
See application file for complete search history.

(56) References Cited

U.S. PATENT DOCUMENTS

| | | |
|---|---|---|
| 6,383,694 B1 | 5/2002 | Wu et al. |
| 6,690,448 B2 | 2/2004 | Kawase et al. |
| 6,787,275 B2 | 9/2004 | Kawase |
| 7,023,511 B1 | 4/2006 | Lee |
| 7,158,198 B2 | 1/2007 | Ozeki et al. |

(Continued)

FOREIGN PATENT DOCUMENTS

| | | |
|---|---|---|
| CN | 1478206 | 2/2004 |
| CN | 1713004 | 12/2005 |

(Continued)

OTHER PUBLICATIONS

"Office Action of Taiwan Counterpart Application", issued on May 26, 2015, p. 1-p. 5.

(Continued)

*Primary Examiner* — Nathanael R Briggs
(74) *Attorney, Agent, or Firm* — Jianq Chyun IP Office

(57) ABSTRACT

A color filter substrate includes a transparent substrate and a plurality of color filter patterns. The transparent substrate has an upper surface and a lower surface opposite to each other, and a plurality of containing cavities. The containing cavities extend from the upper surface toward the lower surface and separate from each other. Each containing cavity has a bottom surface. The color filter patterns are disposed on the transparent substrate and located inside the containing cavities, respectively. The color filter patterns contact with the corresponding bottom surfaces, respectively.

13 Claims, 2 Drawing Sheets

(56) References Cited

U.S. PATENT DOCUMENTS

| | | | |
|---|---|---|---|
| 7,239,364 B2 | 7/2007 | Kawase | |
| 7,897,304 B2 | 3/2011 | Moriya | |
| 2003/0076609 A1* | 4/2003 | Kawase | G02B 5/201 359/885 |
| 2012/0012834 A1* | 1/2012 | Sonoda | G02B 5/201 257/40 |
| 2012/0320310 A1* | 12/2012 | Adachi | G02B 5/045 349/64 |
| 2013/0088769 A1 | 4/2013 | Fujishiro et al. | |
| 2013/0286334 A1* | 10/2013 | Satoh | G02F 1/157 349/106 |
| 2013/0300986 A1* | 11/2013 | Kang | G02B 5/3058 349/96 |

FOREIGN PATENT DOCUMENTS

| | | |
|---|---|---|
| CN | 1902534 | 1/2007 |
| EP | 2568319 | 3/2013 |

OTHER PUBLICATIONS

"Office Action of China Counterpart Application", issued on Jun. 14, 2016, p. 1-p. 7.
"Office Action of China Counterpart Application," issued on Feb. 4, 2017, p. 1-p. 7.

* cited by examiner

COLOR FILTER SUBSTRATE AND DISPLAY DEVICE

CROSS-REFERENCE TO RELATED APPLICATION

This application claims the priority benefit of Taiwan application serial no. 102143038, filed on Nov. 26, 2013. The entirety of the above-mentioned patent application is hereby incorporated by reference herein and made a part of this specification.

BACKGROUND OF THE INVENTION

1. Field of the Invention

The invention is directed to a substrate structure and a display apparatus and more particularly, to a color filter substrate and a display apparatus using the same.

2. Description of Related Art

Color filter patterns are commonly applied to flat panel displays to achieve multi-color display effects. Generally speaking, a color flat panel display apparatus includes an active device array substrate, a color filter substrate and display media therebetween. On the active device array substrate, pixel structures arranged in an array are disposed to drive the display media inside a corresponding pixel region to be presented in a desired optical transmittance. Meanwhile, there are color filter patterns an array arrangement disposed on the surface of the color filter substrate to allow the light passing through the corresponding color filter patterns to be presented in specific colors. However, the conventional color filter patterns being disposed on the surface of the color filter substrate, and thus, the light entering the color filter substrate would produce reflected light having an excessively large tilting angle and passing through color filter patterns with other colors due to reflecting and scattering effects, which results in the color washout phenomenon. Especially, such color washout phenomenon is even more serious when occurring in a reflective flat panel display apparatus.

SUMMARY OF THE INVENTION

The invention provides a color filter substrate contributing to the mitigation of color washout phenomenon for a display apparatus.

The invention is directed to a color filter substrate, including a transparent substrate and a plurality of color filter patterns. The transparent substrate has an upper surface and a lower surface opposite to each other, and a plurality of containing cavities. The containing cavities extend from the upper surface toward the lower surface and separate from each other, and each of the containing cavities has a bottom surface. The color filter patterns are disposed on the transparent substrate and respectively located inside the containing cavities. The color filter patterns are respectively contact with the corresponding bottom surfaces.

In an embodiment of the invention, a horizontal distance is between two sides of two adjacent color filter patterns and the horizontal distance is within a range from 2 micrometers (μm) to 2 millimeters (mm).

In an embodiment of the invention, a vertical distance is between the bottom surface of each of the containing cavities and the upper surface and the vertical distance is within a range from 5 μm to 5 mm.

In an embodiment of the invention, the color filter substrate further includes a planar layer. The planar layer is disposed on the upper surface of the transparent substrate and covers the upper surface, the containing cavities and the color filter patterns.

In an embodiment of the invention, a material of the transparent substrate comprises glass, polyethylene terephthalate (PET), polymethyl methacrylate (PMMA) or polycarbonate (PC).

In an embodiment of the invention, a width between each of the containing cavities is within a range from 9 μm to 9 mm.

The invention is directed to a display apparatus, including the color filter substrate, an active device array substrate and a reflective structure layer. The active device array substrate is disposed opposite to the color filter substrate and located on the lower surface of the transparent substrate. The reflective structure layer is disposed between the active device array substrate and the color filter substrate or on a surface of the active device array substrate relatively away from the color filter substrate.

In an embodiment of the invention, the reflective structure layer is disposed between the active device array substrate and the color filter substrate. The reflective structure layer includes a capsule electrophoretic display medium layer, a micro-cup electrophoretic display medium layer or a cholesteric liquid crystal electrophoretic display medium layer.

In an embodiment of the invention, a material of the transparent substrate comprises polyethylene terephthalate (PET) or polycarbonate (PC).

In an embodiment of the invention, a spacing distance is between the bottom surface of each of the containing cavities and the reflective structure layer and the spacing distance is within a range from 0.1 to 50 micrometers.

In an embodiment of the invention, the display apparatus further includes a display medium layer disposed between the active device array substrate and the color filter substrate. The display medium layer includes a liquid crystal layer or an organic light-emitting layer. The reflective structure layer is disposed on the surface of the active device array substrate relatively away from the color filter substrate.

In an embodiment of the invention, a material of the transparent substrate comprises glass or polymethyl methacrylate (PMMA), and the reflective structure layer is made of a reflecting material.

To sum up, in the invention, the color filter patterns are disposed inside the containing cavities of the transparent substrate, and thus, the thickness of the transparent substrate does not have to meet the current trend toward being light, thin, short and small to be thinned, such that the issue of the color filter substrate being deformed and broken due to having the reduced structural strength after being thinned can be prevented. Therefore, the color filter substrate of the invention can have better structure reliability. Moreover, in the display apparatus using the color filter substrate of the invention, the color filter patterns are located inside the containing cavities of the transparent substrate and thus, when being compared with the conventional color filter patterns disposed on the surface of the color filter substrate, the color filter patterns of the invention can be closer to the reflective structure layer. In this way, the light can be effectively prevented from being randomly scattered and reflected inside the transparent substrate, such that reduce the color washout phenomenon can be mitigated to improve the optical performance of the display apparatus.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
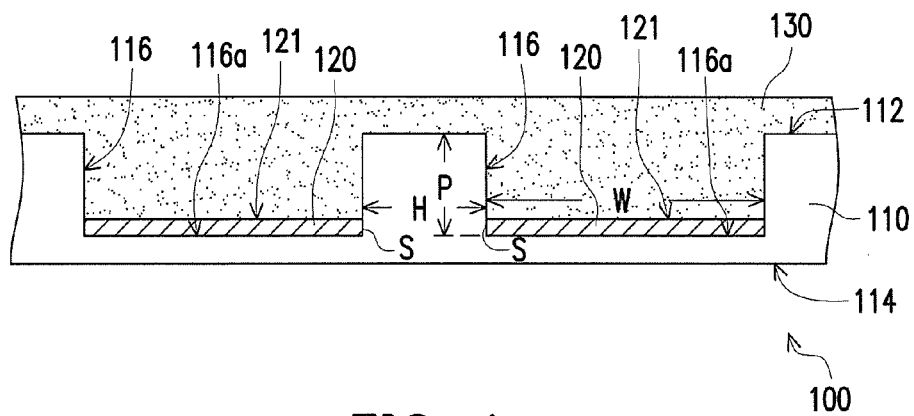
FIG. 1 is a schematic diagram of a color filter substrate according to an embodiment of the invention.

FIG. 1 is a schematic diagram of a color filter substrate according to an embodiment of the invention. With reference to FIG. 1, in the present embodiment, a color filter substrate 100 includes a transparent substrate 110 and a plurality of color filter patterns 120 (which is schematically illustrated as only two in FIG. 1). The transparent substrate 110 has an upper surface 112 and a lower surface 114 opposite to each other, and a plurality of containing cavities 116 (which is schematically illustrated as only two in FIG. 1). The containing cavities 116 extends from the upper surface 112 toward the lower surface 114 and separate from each other. Each of the containing cavities 116 has a bottom surface 116a. The color filter patterns 120 are disposed on the transparent substrate 110 and respectively located inside the containing cavities 116. The color filter patterns 120 respectively contact with the corresponding bottom surfaces 116a of the containing cavities 116.

To be more detailed, in the present embodiment, a material of the transparent substrate 110 is, for example, glass, polyethylene terephthalate (PET) (polyethylene terephthalate, PET), polymethyl methacrylate (PMMA), polycarbonate (PC) (polycarbonate, PC) or any other adaptive transparent material. The color filter patterns 120 directly contact with the bottom surfaces 116a of the containing cavities 116, and there is a vertical distance P between the bottom surface 116a of each of the containing cavities 116 and the upper surface 112 of the transparent substrate 110. Preferably, the vertical distance P is within a range from 5 micrometers (μm) to 5 millimeters (mm), and there is a horizontal distance H between two sides S of two substrate color filter patterns 120. Preferably, the horizontal distance H is within a range from 2 μm to 2 mm. A width W of each of the containing cavities 116 is within a range from 9 μm to 9 mm. The vertical distance P, the horizontal distance H and the width W are determined depending on the material selected for the transparent substrate 110.

The color filter patterns 120 of the present embodiment may be, for example, red filter patterns, blue filter patterns, green filter patterns or a combination thereto. Referring to FIG. 1, there is a height difference between a top surface 121 of the color filter patterns 120 of the present embodiment and the upper surface 112 of the transparent substrate 110. Accordingly, in order to have better assembly flatness in follow-up process, the color filter substrate 100 of the present embodiment, may further include a planar layer 130, wherein the planar layer 130 is disposed on the upper surface 112 of the transparent substrate 110 and covers the upper surface 112, the containing cavities 116 and the color filter patterns 120. In this case, the planar layer 130 is made of a polymer material, such as epoxy polymer material and acrylic polymer material.

In the present embodiment, due to the color filter patterns 120 being disposed inside the containing cavities 116 of the transparent substrate 110, the thickness of the transparent substrate 110 does not have to meet the current trend toward being light, thin, short and small to be thinned, such that the issue of the color filter substrate 100 being deformed and broken due to having the reduced structural strength after being thinned can be prevented. Therefore, the color filter substrate 100 of the present embodiment can have better structure reliability.

Figure 2:
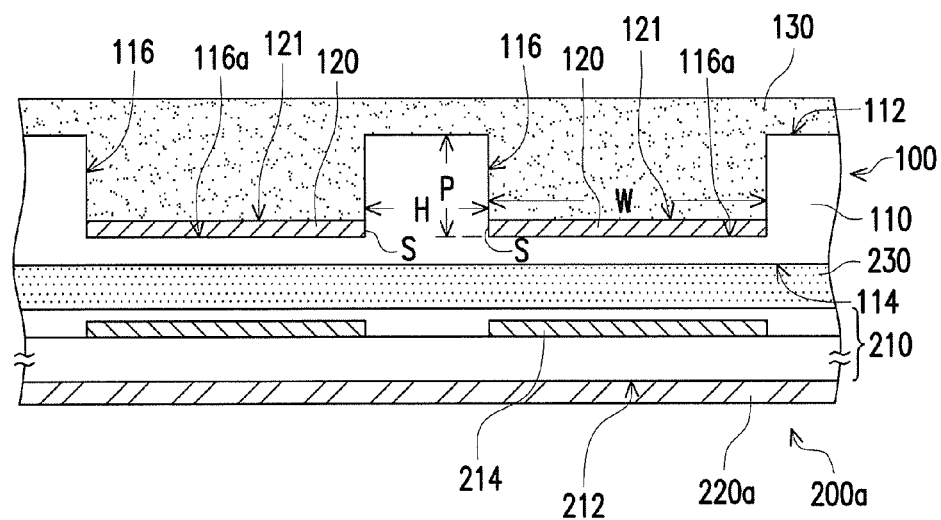
FIG. 2 is a schematic diagram of a display apparatus according to an embodiment of the invention.

FIG. 2 is a schematic diagram of a display apparatus according to an embodiment of the invention. With reference to FIG. 2, a display apparatus 200a of the present embodiment includes the color filter substrate 100 of FIG. 1, an active device array substrate 210 and a reflective structure layer 220a. To be more detailed, in the present embodiment, the active device array substrate 210 and the color filter substrate 100 are disposed opposite to each other and located on the lower surface 114 of the transparent substrate 110. The active device array substrate 210 has a plurality of pixel units 214 (which is schematically illustrated as only two in FIG. 2), and each of the pixel units 214 corresponds to one color filter pattern 120, but the invention is not limited thereto. The reflective structure layer 220a is disposed on a surface 212 of the active device array substrate 210 relatively away from the color filter substrate 100. In this case, a material of the transparent substrate 110 is glass or polymethyl methacrylate (PMMA). Preferably, the vertical distance P between the bottom surface 116a of each of the containing cavities 116 and the upper surface 112 of the transparent substrate 110 is within the range from 5 μm to 5 mm, the horizontal distance H between the two sides S of the two adjacent color filter patterns 120 is within the range from 2 μm to 2 mm, and the width W of each of the containing cavities 116 is within the range from 9 μm to 9 mm. The reflective structure layer 220a is made of a reflecting material, e.g., a metal or an alloy.

Additionally, the display apparatus 200a of the present embodiment further includes a display medium layer 230 disposed between the active device array substrate 210 and the color filter substrate 100, wherein the display medium layer 130 includes a liquid crystal layer or an organic light-emitting layer. That is to say, the display apparatus 200a of the present embodiment may be a liquid crystal display (LCD) apparatus or an organic electroluminescent (OEL) display apparatus.

Specially, the transparent substrate 110 of the present embodiment has the containing cavities 116, and the color filter patterns 120 are disposed inside the containing cavities 116. Thus, when being compared with the conventional color filter patterns disposed on the surface of the color filter substrate, the color filter patterns 120 of the present embodiment that are located inside the containing cavities 116 is closer to the reflective structure layer 220a located under the active device array substrate 210. Thereby, the light (not shown) can be effectively prevented from being randomly scattered and reflected inside the transparent substrate 110, such that reduce the color washout phenomenon can be mitigated to improve the optical performance of the display apparatus 200a.

Figure 3:
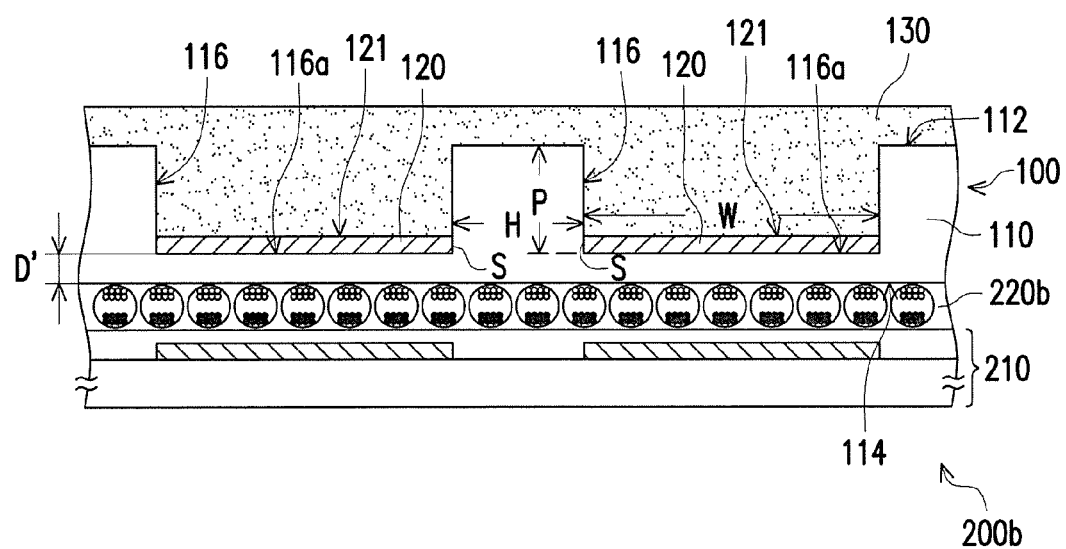
FIG. 3 is a schematic diagram of a display apparatus according to another embodiment of the invention.

FIG. 3 is a schematic diagram of a display apparatus according to another embodiment of the invention. The present embodiment still use the reference numerals and a part of the contents of the aforementioned embodiments, wherein like reference numerals denote the same or like elements throughout, and descriptions of the same technical contents are omitted. The aforementioned embodiments can be referred for the descriptions of the omitted part of the present embodiment, so that detailed descriptions thereof are not repeated.

With reference to FIG. 3, a display apparatus 200b of the present embodiment is similar to the display apparatus 200a of the previous embodiment and mainly different therefrom in that a reflective structure layer 220b of the present embodiment is disposed between the active device array substrate 210 and the color filter substrate 100, and the reflective structure layer 220b is, for example, a capsule electrophoretic display medium layer, a micro-cup electrophoretic display medium layer or a cholesteric liquid crystal electrophoretic display medium layer. Referring to FIG. 3, the reflective structure layer 220b is illustrated as a capsule electrophoretic display medium layer for example in the present embodiment. In this case, a material of the transparent substrate 110 is, for example, polyethylene terephthalate (PET) or polycarbonate (PC). Preferably, the vertical distance P between the bottom surface 116a of each of the containing cavities 116 and the upper surface 112 of the transparent substrate 110 is within the range from 5 μm to 5 mm, the horizontal distance H between the two sides S of the two adjacent color filter patterns 120 is within the range from 2 μm to 2 mm, and the width W of each of the containing cavities 116 is within the range from 9 μm to 9 mm. In brief, the color filter substrate 100 and the reflective structure layer 220b of the present embodiment may be considered as an electronic paper display.

Specially, there is a spacing distance D' between the bottom surface 116a of each of the containing cavities 116 of the transparent substrate 110 of the present embodiment and the reflective structure layer 220b. Preferably, the spacing distance D' is within a range from 0.1 μm to 50 μm. That is to say, the color filter patterns 120 directly contacting with the bottom surface 116a of each of the containing cavities 116 separate from the reflective structure layer 220b merely by the spacing distance D' from 0.1 μm to 50 μm. When being compared with the conventional color filter patterns disposed on the surface of the color filter substrate, the color filter patterns 120 of the present embodiment located inside the containing cavities 116 is closer to the reflective structure layer 220b under the color filter substrate 100. Thereby, the light (not shown) can be effectively prevented from being randomly scattered and reflected inside the transparent substrate 110, such that the color washout phenomenon can be mitigated to improve the optical performance of the display apparatus 200b.

It should be mentioned that the electronic paper display may be applied to a scope from as small as a small handheld device to as large as a large outdoor billboard, the thickness of the transparent substrate 110 varies with the material that is selected, such that parameters, such as the vertical distance P, the horizontal distance H and the width W are influenced. For instance, in case that the electronic paper display is applied to a small-size product, the vertical distance P is preferably within a range from 5 μm to 500 μm, the horizontal distance H is preferably within a range from 2 μm to 200 μm, and the width W is preferably within a range from 9 μm to 900 μm. On the other hand, when in case that the electronic paper display is applied to a large-size product, the vertical distance P is preferably within a range from 0.1 mm to 5 mm, the horizontal distance H is preferably within a range from 0.1 mm to 2 mm, and the width W is preferably within a range from 0.1 mm to 9 mm.

To sum up, in the invention, the color filter patterns are disposed inside the containing cavities of the transparent substrate, and thus, the thickness of the transparent substrate does not have to meet the current trend toward being light, thin, short and small to be thinned, such that the issue of the color filter substrate being deformed and broken due to having the reduced structural strength after being thinned can be prevented. Therefore, the color filter substrate of the invention can have better structure reliability. Moreover, in the display apparatus using the color filter substrate of the invention, the color filter patterns are located inside the containing cavities of the transparent substrate and thus, when being compared with the conventional color filter patterns disposed on the surface of the color filter substrate, the color filter patterns of the invention can be closer to the reflective structure layer. In this way, the light can be effectively prevented from being randomly scattered and reflected inside the transparent substrate, such that the color washout phenomenon can be mitigated to improve the optical performance of the display apparatus.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A display apparatus, comprising:
a color filter substrate, comprising:
a transparent substrate, having an upper surface and a lower surface opposite to each other, and a plurality of containing cavities, wherein the containing cavities extend from the upper surface toward the lower surface and separate from each other, and each of the containing cavities has a bottom surface; and
a plurality of color filter patterns, disposed on the transparent substrate and respectively located inside the containing cavities, wherein the color filter patterns are respectively contacting with the corresponding bottom surfaces;
an active device array substrate, disposed opposite to the color filter substrate and located on the lower surface of the transparent substrate; and
a reflective structure layer, disposed between the active device array substrate and the color filter substrate or on a surface of the active device array substrate relatively away from the color filter substrate, wherein the active device array substrate is disposed closer to the bottom surface of each of the containing cavities than the upper surface of the transparent substrate.

2. The display apparatus as recited in claim 1, wherein a horizontal distance is between two sides of two adjacent color filter patterns and the horizontal distance is within a range from 2 micrometers to 2 millimeters.

3. The display apparatus as recited in claim 1, wherein a vertical distance is between the bottom surface of each of the containing cavities and the upper surface and within a range from 5 micrometers to 5 millimeters.

4. The display apparatus as recited in claim 1, further comprising:
a planar layer, disposed on the upper surface of the transparent substrate and covering the upper surface, the containing cavities and the color filter patterns.

5. The display apparatus as recited in claim 1, wherein a material of the transparent substrate comprises glass, polyethylene terephthalate (PET), polymethyl methacrylate (PMMA) or polycarbonate (PC).

6. The display apparatus as recited in claim 1, wherein a width between each of the containing cavities is within a range from 9 micrometers to 9 millimeters.

7. The display apparatus as recited in claim 1, wherein the reflective structure layer is disposed between the active device array substrate and the color filter substrate, and the reflective structure comprises a capsule electrophoretic display medium layer, a micro-cup electrophoretic display medium layer or a cholesteric liquid crystal electrophoretic display medium layer.

8. The display apparatus as recited in claim 7, wherein a material of the transparent substrate comprises polyethylene terephthalate (PET) or polycarbonate (PC).

9. The display apparatus as recited in claim 7, where a spacing distance is between the bottom surface of each of the containing cavities and the reflective structure layer and the spacing distance is within a range from 0.1 to 50 micrometers.

10. The display apparatus as recited in claim 1, further comprising:

a display medium layer, disposed between the active device array substrate and the color filter substrate, wherein the display medium layer comprises a liquid crystal layer or an organic light-emitting layer, the reflective structure layer is disposed on the surface of the active device array substrate relatively away from the color filter substrate.

11. The display apparatus as recited in claim 10, wherein a material of the transparent substrate comprises glass or polymethyl methacrylate (PMMA), and the reflective structure layer is made of a reflecting material.

12. The display apparatus as recited in claim 1, wherein there is a height difference between a top surface of each of the color filter patterns and the upper surface of the transparent substrate.

13. The display apparatus as recited in claim 1, wherein a thickness of each of the color filter patterns is smaller than a height between the upper surface of the transparent substrate and the bottom surface of the containing cavities.

* * * * *